(12) United States Patent
Rofougaran et al.

(10) Patent No.: US 8,447,250 B2
(45) Date of Patent: May 21, 2013

(54) METHOD AND SYSTEM FOR AN INTEGRATED VOLTAGE CONTROLLED OSCILLATOR-BASED TRANSMITTER AND ON-CHIP POWER DISTRIBUTION NETWORK

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 432 days.

(21) Appl. No.: 12/650,324

(22) Filed: Dec. 30, 2009

(65) Prior Publication Data
US 2010/0311472 A1    Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
*H04B 1/04* (2006.01)
*H04B 7/00* (2006.01)
*H04M 1/00* (2006.01)

(52) U.S. Cl.
USPC ............... 455/129; 455/562.1; 455/232.1; 455/121; 343/700 MS

(58) Field of Classification Search
USPC ............... 455/127.3, 293, 352, 129, 232.1
See application file for complete search history.

(56) References Cited

U.S. PATENT DOCUMENTS

| | | | |
|---|---|---|---|
| 5,138,436 A | 8/1992 | Koepf |
| 5,300,875 A | 4/1994 | Tuttle |
| 5,363,075 A | 11/1994 | Fanucchi |
| 5,387,885 A | 2/1995 | Chi |
| 5,717,943 A | 2/1998 | Barker |
| 5,900,843 A | 5/1999 | Lee |
| 5,912,598 A | 6/1999 | Stones |
| 6,005,520 A | 12/1999 | Nalbandian |
| 6,037,743 A | 3/2000 | White |
| 6,127,799 A | 10/2000 | Krishnan |

(Continued)

OTHER PUBLICATIONS

Iyer et al., "Wireless chip to chip interconnections for multichip modules using leaky wave antennas", Nov. 1993, pp. 2030-2031.

(Continued)

*Primary Examiner* — Tilahun B Gesesse
(74) *Attorney, Agent, or Firm* — Farjami & Farjami LLP

(57) ABSTRACT

Methods and systems for an integrated voltage controlled oscillator (VCO)-based transmitter and on-chip power distribution network are disclosed and may include supplying bias voltages and/or ground to a chip utilizing conductive lines. One or more VCOs and low-noise amplifiers (LNAs) may each be coupled to a leaky wave antenna (LWA) integrated in the bias voltage and/or ground lines. One or more clock signals may be generated utilizing the VCOs, which may be transmitted from the LWAs coupled to the VCOs, to the LWAs coupled to the LNAs. RF signals may be transmitted via the LWAs, and may include 60 GHz signals. The LWAs may include microstrip and/or coplanar waveguides, where a cavity length of the LWAs may be dependent on a spacing between conductive lines in the waveguides. The LWAs may be dynamically configured to transmit the clock signals at a desired angle from a surface of the chip.

20 Claims, 9 Drawing Sheets

U.S. PATENT DOCUMENTS

| | | | |
|---|---|---|---|
| 6,212,431 B1 | 4/2001 | Hahn | |
| 6,285,325 B1 | 9/2001 | Nalbandian | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,020,701 B1 | 3/2006 | Gelvin | |
| 7,023,374 B2 * | 4/2006 | Jossef et al. | 342/20 |
| 7,084,823 B2 | 8/2006 | Caimi | |
| 7,156,172 B2 * | 1/2007 | Becker et al. | 166/288 |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,394,288 B1 | 7/2008 | Agarwal | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 * | 6/2010 | Margomenos et al. | 342/70 |
| 7,855,696 B2 | 12/2010 | Gummalla | |
| 8,195,103 B2 * | 6/2012 | Waheed et al. | 455/114.3 |
| 8,242,957 B2 | 8/2012 | Rofougaran | |
| 8,285,231 B2 | 10/2012 | Rofougaran | |
| 2002/0000936 A1 | 1/2002 | Sheen | |
| 2002/0135568 A1 | 9/2002 | Chen | |
| 2004/0066251 A1 | 4/2004 | Eleftheriades | |
| 2004/0203944 A1 | 10/2004 | Huomo | |
| 2004/0227668 A1 | 11/2004 | Sievenpiper | |
| 2004/0263378 A1 * | 12/2004 | Jossef et al. | 342/20 |
| 2004/0263408 A1 | 12/2004 | Sievenpiper | |
| 2005/0012667 A1 | 1/2005 | Noujeim | |
| 2005/0052424 A1 | 3/2005 | Shih | |
| 2005/0116864 A1 | 6/2005 | Mohamadi | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0281423 A1 | 12/2006 | Caimi | |
| 2007/0171076 A1 | 7/2007 | Stevens | |
| 2007/0190952 A1 * | 8/2007 | Waheed et al. | 455/114.3 |
| 2007/0285248 A1 | 12/2007 | Hamel | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0284085 A1 | 11/2008 | Curina | |
| 2008/0287085 A1 * | 11/2008 | Forstner et al. | 455/293 |
| 2008/0316135 A1 | 12/2008 | Hilgers | |
| 2009/0108996 A1 | 4/2009 | Day | |
| 2009/0160612 A1 | 6/2009 | Varpula | |
| 2009/0251362 A1 * | 10/2009 | Margomenos et al. | 342/175 |
| 2010/0110943 A2 | 5/2010 | Gummalla | |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 * | 12/2010 | Rofougaran et al. | 327/297 |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Roufougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 * | 12/2010 | Rofougaran et al. | 455/572 |
| 2010/0311493 A1 | 12/2010 | Miller | |
| 2012/0095531 A1 | 4/2012 | Derbas | |
| 2012/0153731 A9 | 6/2012 | Kirby | |
| 2012/0263256 A1 * | 10/2012 | Waheed et al. | 375/296 |

OTHER PUBLICATIONS

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

Feresidis et al., "Flat Plate Millimetre Wave Antenna Based on Partially Reflective FSS", 11th International Conference on Antennas and Propagation, 2001, pp. 33-36.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity . . . Antennas", Electronics Letters, 2007.

Kimoto et al., "On-Chip Wireless Signal Transmission using Silicon Integrated Antennas", Measurement 40, No. 30 (2004): 20.

* cited by examiner

METHOD AND SYSTEM FOR AN INTEGRATED VOLTAGE CONTROLLED OSCILLATOR-BASED TRANSMITTER AND ON-CHIP POWER DISTRIBUTION NETWORK

CROSS-REFERENCE TO RELATED APPLICATIONS/INCORPORATION BY REFERENCE

This application also makes reference to:
U.S. patent application Ser. No. 12/650,212filed on Dec. 30, 2009;
U.S. patent application Ser. No. 12/650,295filed on Dec. 30, 2009;
U.S. patent application Ser. No. 12/650,277filed on Dec. 30, 2009;
U.S. patent application Ser. No. 12/650,192filed on Dec. 30, 2009;
U.S. patent application Ser. No. 12/650,224filed on Dec. 30, 2009;
U.S. patent application Ser. No. 12/650,176filed on Dec. 30, 2009;
U.S. patent application Ser. No. 12/650,246filed on Dec. 30, 2009; and
U.S. patent application Ser. No. 12/650,292filed on Dec. 30, 2009.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for an integrated voltage controlled oscillator-based transmitter and on-chip power distribution network.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for an integrated voltage controlled oscillator-based transmitter and on-chip power distribution network, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for an integrated voltage controlled oscillator-based transmitter and on-chip power distribution network. Exemplary aspects of the invention may comprise supplying one or more bias voltages and/or ground to a chip utilizing the bias voltage and ground lines, respectively. One or more voltage-controlled oscillators and one or more low-noise amplifiers may be integrated on the chip and each of the one or more voltage-controlled oscillators and the one or more low-noise amplifiers may be communicatively coupled to a leaky wave antenna integrated in the bias voltage and/or ground lines to the chip. One or more clock signals may be generated utilizing the one or more voltage-controlled oscillators. The generated clock signals may be transmitted by the leaky wave antennas communicatively coupled to the one or more voltage-controlled oscillators to the one or more leaky wave antennas communicatively coupled to the one or more low-noise amplifiers.

Radio frequency (RF) signals may be transmitted via the one or more leaky wave antennas, and may comprise 60 GHz signals. The leaky wave antennas comprise microstrip and/or coplanar waveguides, where a cavity length of the leaky wave antennas may be dependent on a spacing between conductive lines in the microstrip and/or coplanar waveguides. The leaky wave antennas may be configured to transmit the one or more generated clock signals at a desired angle from a surface of the chip. The angle from the surface of the chip may be dynamically configured. A gain of the one or more low-noise amplifiers may be configured for receiving the transmitted clock signals.

Figure 1:
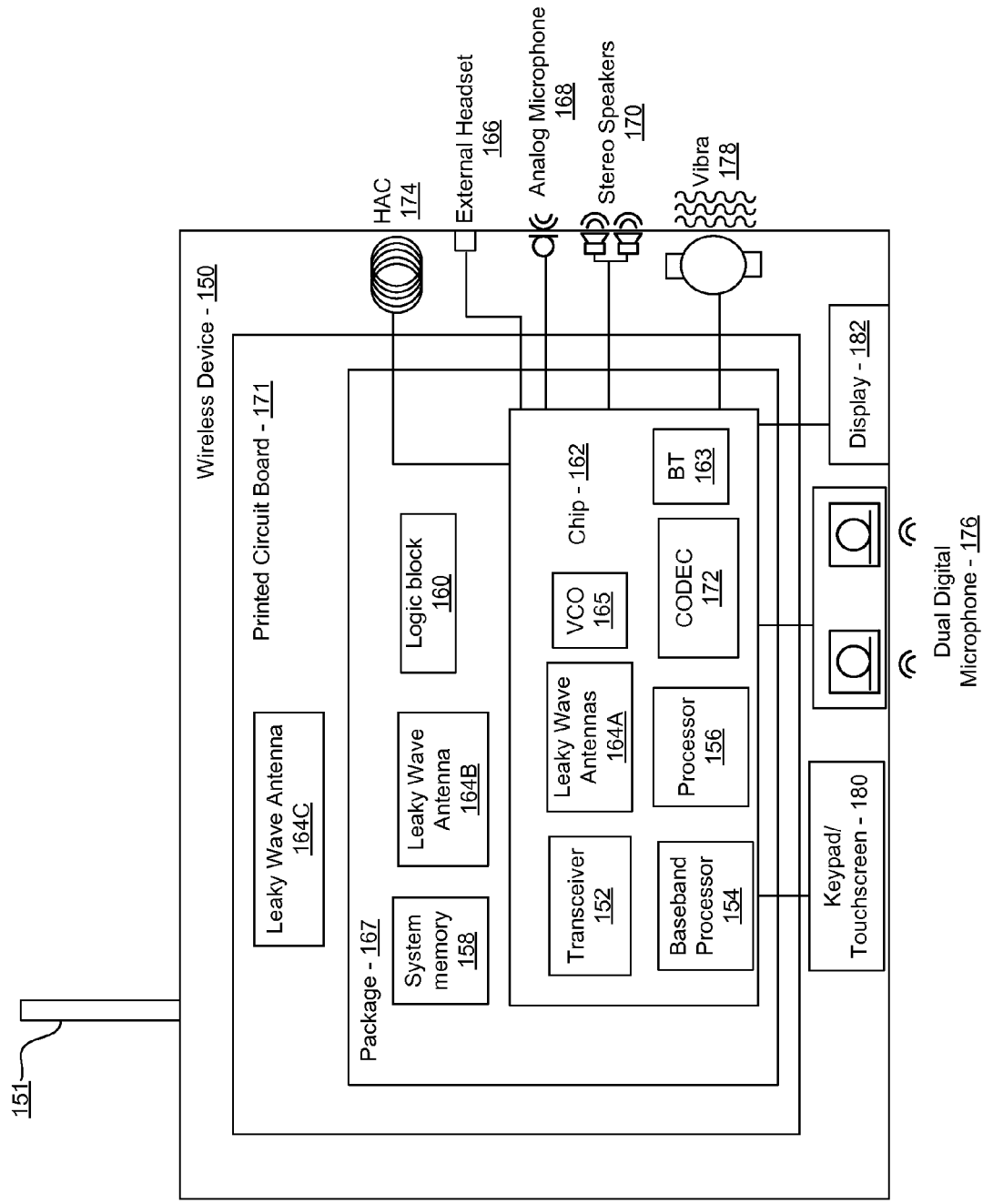
FIG. 1 is a block diagram of an exemplary wireless system with an integrated voltage controlled oscillator-based transmitter and on-chip power distribution network, which may be utilized in accordance with an embodiment of the invention.

FIG. 1 is a block diagram of an exemplary wireless system with an integrated voltage controlled oscillator-based transmitter and on-chip power distribution network, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, a voltage-controlled oscillator (VCO) 165, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A and 164B. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The VCO 165 may comprise suitable circuitry, logic, interfaces, and/or code that may be operable to generate a clock signal for use by various circuitry in the chip 162.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The lower reflectivity surface may allow the resonant mode to "leak" out of the cavity. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of transmission and/or the beam pattern radiated. In another embodiment of the invention, the leaky wave antenna 164B may be integrated in and/or on the package 167, and the leaky wave antenna 164C may be integrated in and/or on the printed circuit board 171 to which the chip 162 may be affixed. In this manner, the dimensions of the leaky wave antennas 164B and 164C may not be limited by the size of the chip 162.

In an exemplary embodiment of the invention, the leaky wave antennas 164A may comprise a plurality of leaky wave antennas integrated in and/or on the chip 162, and may be integrated into power traces in and/or on the chip 162. In this manner, the power traces may be utilized to transmit a clock signal for the chip 162 as well as provide power to various regions of the chip 162. Accordingly, separate signal lines may not be required to carry clock signals for various regions of the chip 162.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAG coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A may be integrated in power traces in and/or on the chip 162, thereby providing transmission and receiving capability with conductive traces that also supply power to the chip 162. In an exemplary embodiment of the invention, one leaky wave antenna of the leaky wave antennas 164A may transmit a clock signal generated by the VCO 165, and the other leaky wave antennas of the leaky wave antennas 164A may be operable to receive the transmitted signal. Low-noise amplifiers in the transceiver 152 may amplify the signals received from the leaky wave antennas, thereby generating a plurality of clock signals locally from a centrally generated clock signal without the need for separate clock traces throughout the chip 162.

Figure 2:
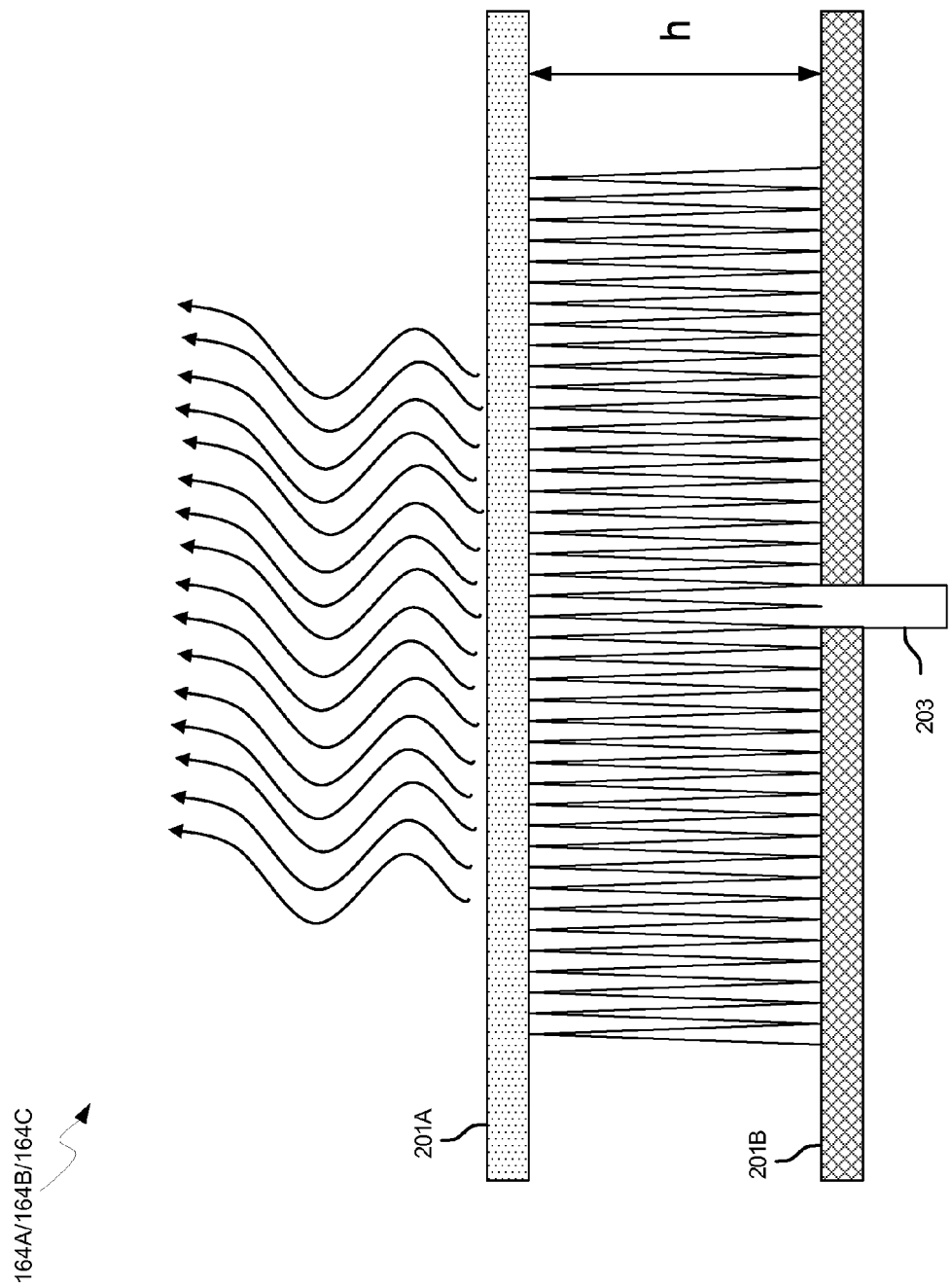
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A, 164B, and/or 164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antenna 164A, 164B, and/or 164C.

The feed point 203 may comprise a input terminal for applying an input voltage to the leaky wave antenna 164A, 164B, and/or 164C. The invention is not limited to a single feed point 203, as there may be any amount of feed points for different phases of signal, for example, to be applied to the leaky wave antenna 164A, 164B, and/or 164C.

In an embodiment of the invention, the height, h, may be one-half the wavelength of the desired transmitted mode from the leaky wave antenna 164A, 164B, and/or 164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 164A, 164B, and/or 164C. The input impedance of the leaky wave antenna 164A, 164B, and/or 164C may be configured by the vertical placement of the feed point 203, as described further in FIG. 6.

In operation, a signal to be transmitted via a power amplifier may be communicated to the feed point 203 of the leaky wave antennas 164A, 164B, and/or 164C with a frequency f. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have travelled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A may be integrated in power traces in and/or on the chip 162, thereby providing transmission and receiving capability with conductive traces that also supply power to the chip 162. In an exemplary embodiment of the invention, one leaky wave antenna of the leaky wave antennas 164A may transmit a clock signal generated by the VCO 165, and the other leaky wave antennas of the leaky wave antennas 164A may be operable to receive the transmitted signal. Low-noise amplifiers in the transceiver 152 may amplify the signals received from the leaky wave antennas, thereby generating a plurality of clock signals locally from a centrally generated clock signal without the need for separate clock traces throughout the chip 162.

Figure 3:
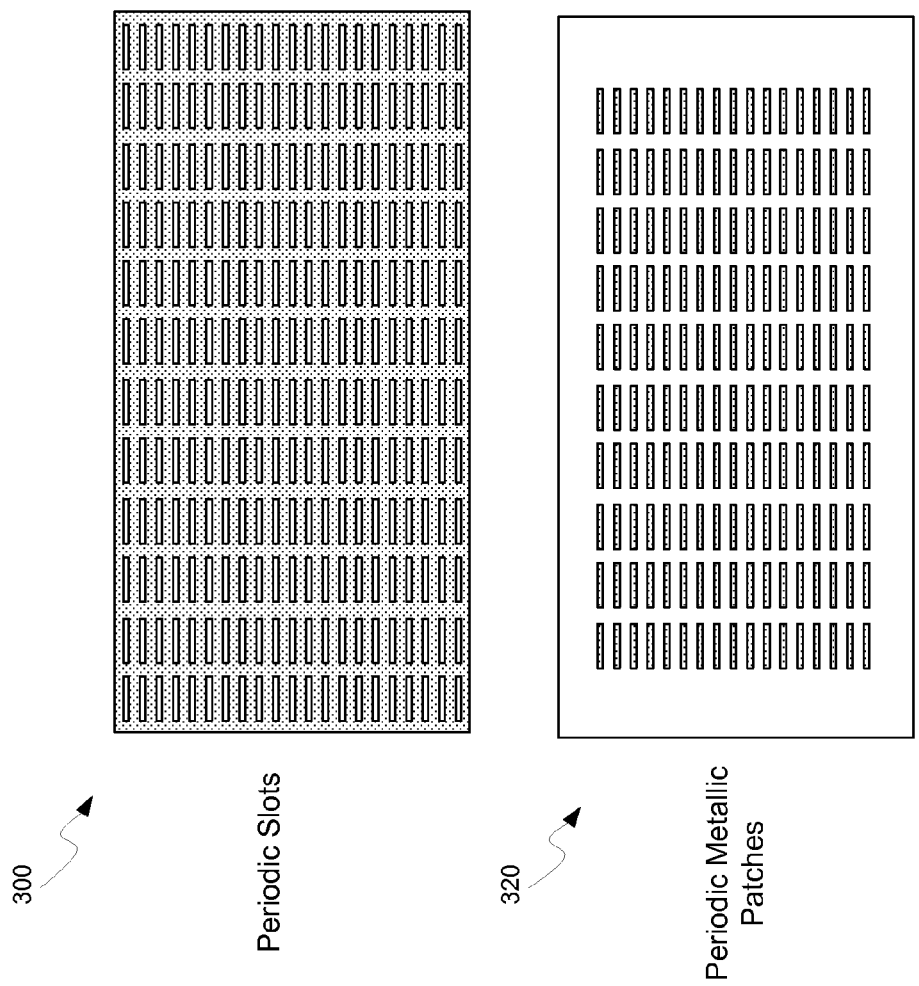
FIG. 3 is a block diagram illustrating a plan view of exemplary partially reflective surfaces, in accordance with an embodiment of the invention.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via micro-electromechanical system (MEMS) switches to tune the Q of the resonant cavity.

Figure 4:
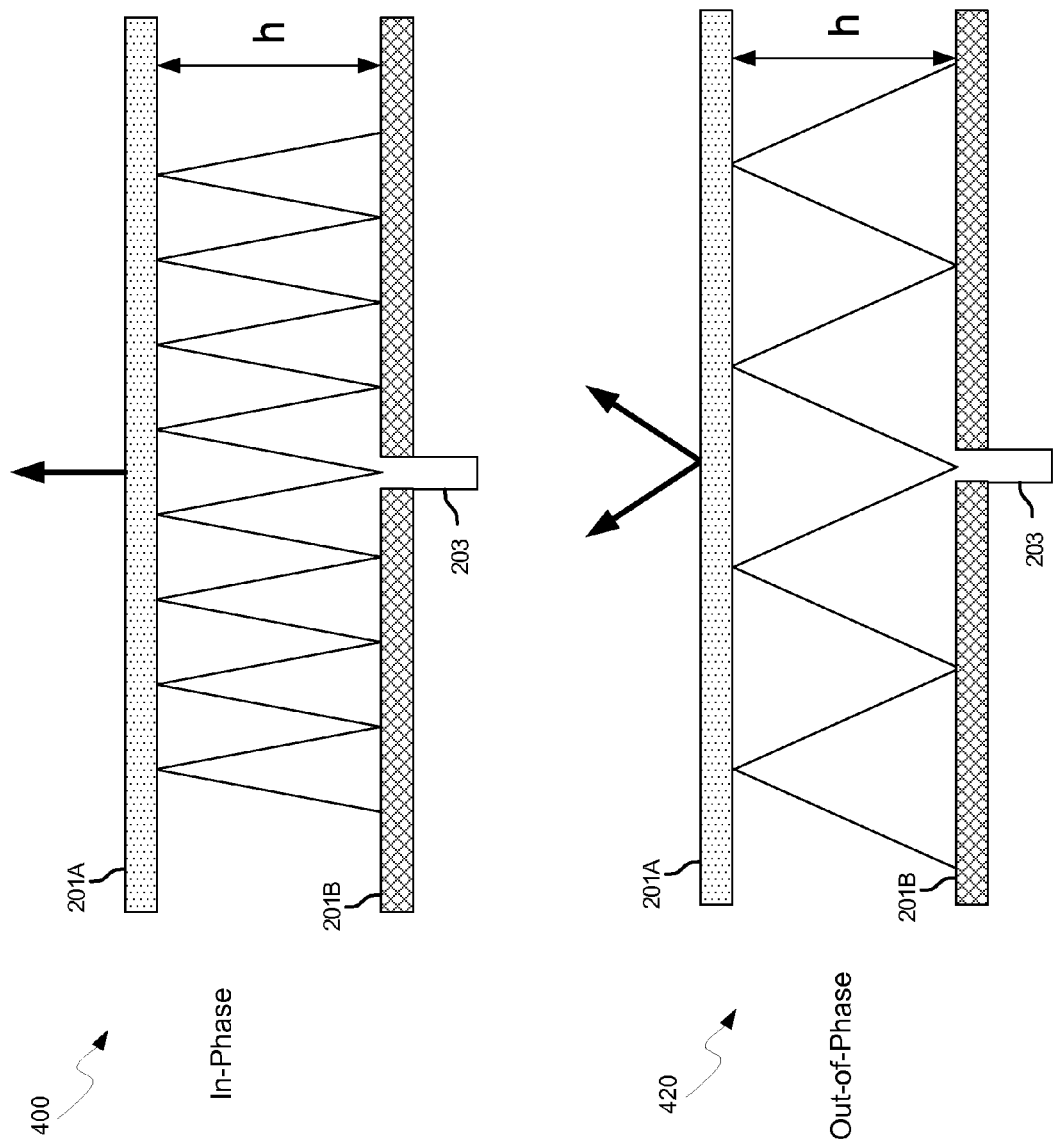
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antenna 164A, 164B, and/or 164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antenna 164A, 164B, and/or 164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A may be integrated in power traces in and/or on the chip 162, thereby providing a plurality of transmission and reception sites on the chip 162 as well as providing power and ground lines. By configuring the leaky wave antennas for in-phase and out-of-phase conditions, signals may be directed out of the chip 162 in desired directions. In an exemplary embodiment of the invention, the angle at which signals may be transmitted by a leaky wave antenna may be dynamically controlled so that signal may be directed to desired receiving leaky wave antennas.

Figure 5:
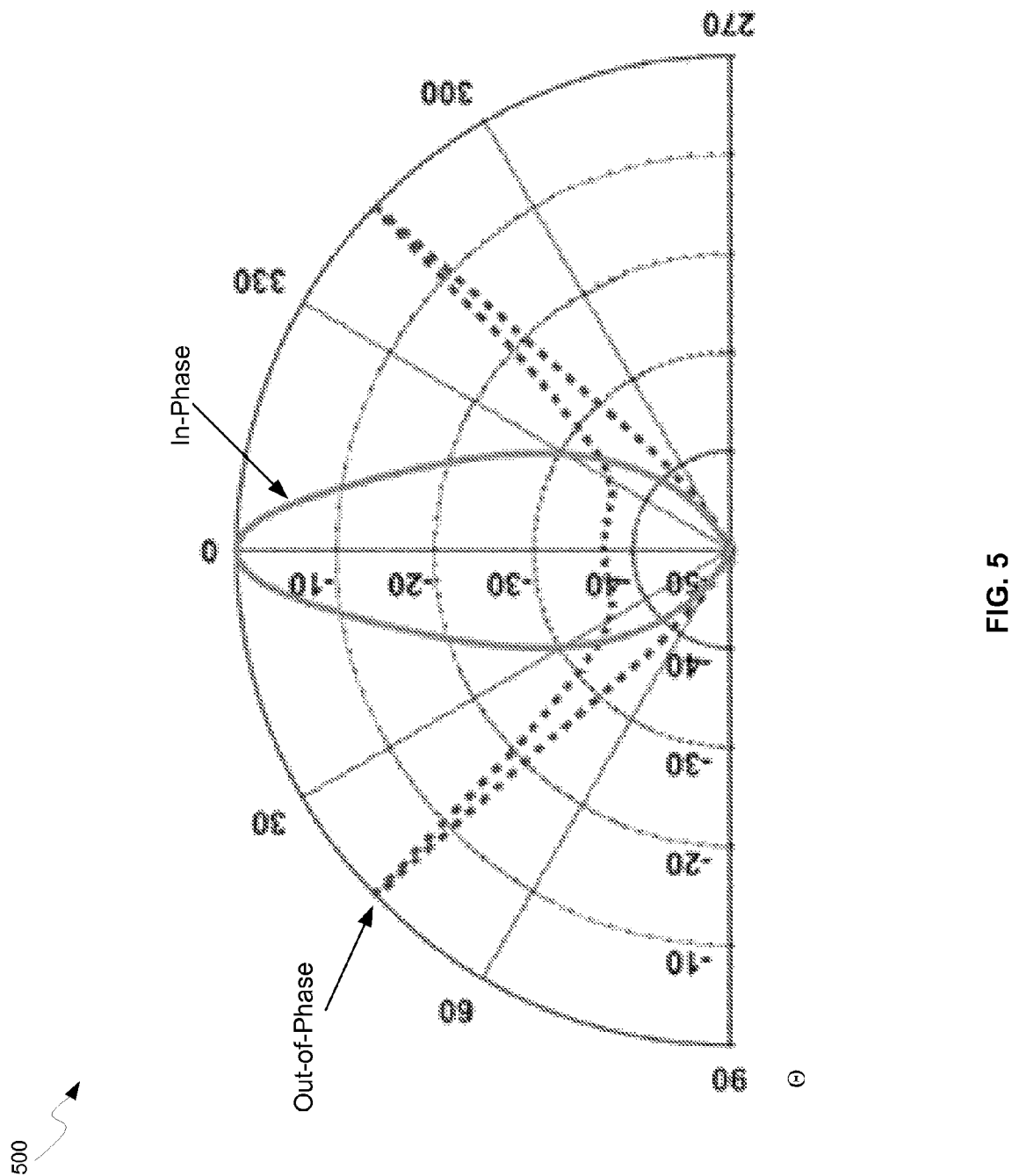
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, Θ, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of the chip 162 in desired directions.

Figure 6:
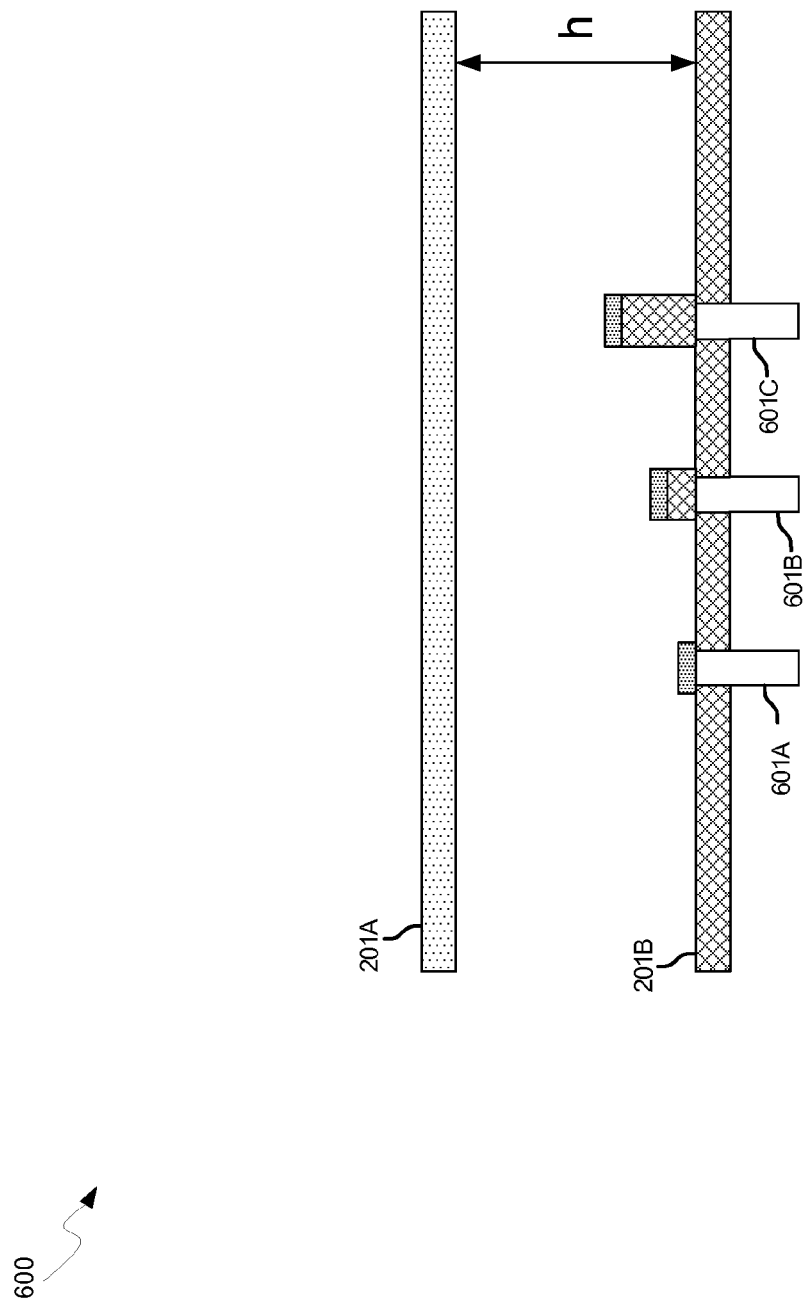
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be utilized to couple to a plurality of power amplifiers or low-noise amplifiers with varying output impedances. Similarly, by integrating leaky wave antennas in power and ground traces, the impedance of the leaky wave antenna may be matched to the power amplifier or low-noise amplifier communicating a signal to be transmitted or a signal that was received.

Figure 7A:
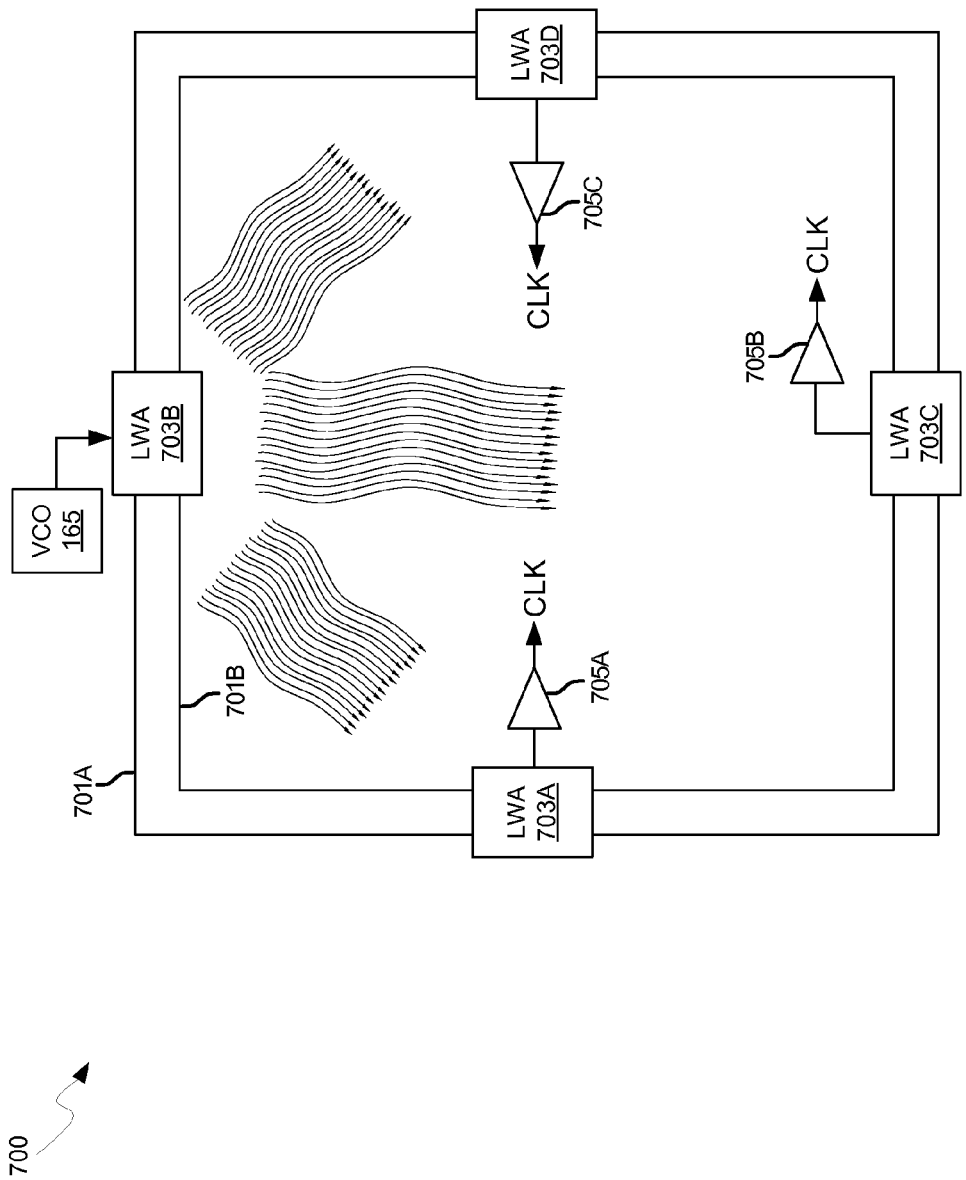
FIG. 7A is a block diagram of exemplary integrated voltage controlled oscillator-based transmitter and on-chip power distribution network, in accordance with an embodiment of the invention.

FIG. 7A is a block diagram of exemplary integrated voltage controlled oscillator-based transmitter and on-chip power distribution network, in accordance with an embodiment of the invention. Referring to FIG. 7A, there is shown integrated voltage controlled oscillator-based transmitter and on-chip power distribution network 700 comprising a $V_{DD}$ line 701A, a ground line 701B, leaky wave antennas 703A-703D, the VCO 165, and low-noise amplifiers (LNAs) 705A-705C.

The $V_{DD}$ line 701A and the ground line 701B may comprise metal, or other conductive material, traces integrated in and/or on a chip, such as the chip 162. The $V_{DD}$ line 701A and the ground line 701B may provide power to the chip 162 and may also be utilized to transmit and/or receive RF signals by integrating leaky wave antennas in the conductive traces.

The leaky wave antennas 703A-703D may be substantially similar to the leaky wave antennas 164A, 164B, and 164C, and may be integrated in and/or on the $V_{DD}$ line 701A and the ground line 701B. In an exemplary embodiment of the invention, the leaky wave antenna 703A may be operable to receive input signals to be transmitted from the VCO 165. The leaky wave antennas 703A, 703C, and/or 703D may be operable to receive signals that may be transmitted from the leaky wave antenna 703B.

The LNAs 705A-705C may comprise suitable circuitry, logic, interfaces, and/or code that may be operable to amplify signals received from the leaky wave antennas 703A, 703C, and 703D, respectively. The LNAs 705A-705C may therefore be operable to generate clock signals, CLK, which may be utilized by various circuitry in the chip 162.

In operation, the VCO 165 may generate a clock signal that may be transmitted by the leaky wave antenna 703B. The leaky wave antennas 703A, 703C, and/or 703D may receive the signal transmitted by the leaky wave antenna 703B. The LNAs 705A-705C may amplify the received signals, thereby generating distributed clock signals on the chip 162 from a single clock source, the VCO 165. By integrating the leaky wave antennas 703A-703D into the $V_{DD}$ line 701A and the ground line 701B, power may be supplied to the chip 162 and signals may be transmitted from one region of the chip 162 to a plurality of locations, thereby distributing clock signals across the chip 162 without the need for lengthy clock traces that may degrade high speed clock signals.

The leaky wave antennas 703A-703D may comprise microstrip and/or coplanar waveguides formed by the $V_{DD}$ line 701A and the ground line 701B. The leaky wave antennas 703A-703D may be distributed in a plurality of locations along the $V_{DD}$ line 701A and the ground line 701B.

The invention is not limited to a single bias voltage and ground line. Accordingly, any number of bias voltage lines may be incorporated, depending on desired voltage levels and chip space requirements, for example. Thus, leaky wave antennas may be integrated into two bias voltage lines or between signal lines and a ground line.

Figure 7B:
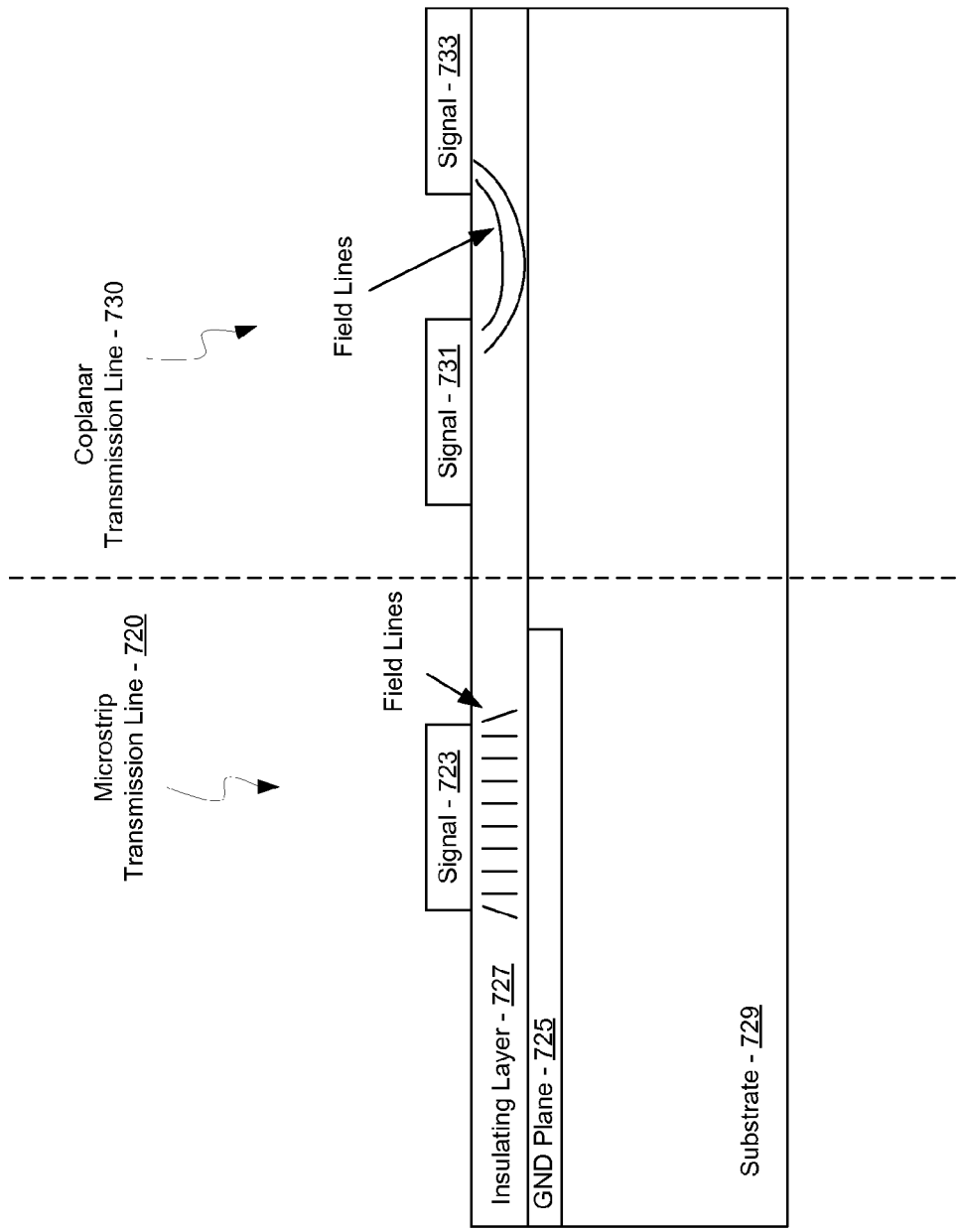
FIG. 7B is a block diagram illustrating a cross-sectional view of coplanar and microstrip transmission lines, in accordance with an embodiment of the invention.

FIG. 7B is a block diagram illustrating a cross-sectional view of coplanar and microstrip transmission lines, in accordance with an embodiment of the invention. Referring to FIG. 7B, there is shown a microstrip transmission line 720 and a coplanar transmission line 730, either of which may be used in the $V_{DD}$ line 701A and/or the ground line 701B described with respect to FIG. 7A. The microstrip transmission line 720 may comprise signal conductive lines 723, a ground plane 725, an insulating layer 727 and a substrate 729. The coplanar transmission line 730 may comprise signal conductive lines 731 and 733, the insulating layer 727, and the substrate 729.

The signal conductive lines 723, 731, and 733 may comprise metal traces deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The insulating layer 727 may comprise $SiO_2$ or other insulating material that may provide a high resistance layer between the signal conductive line 723 and the ground plane 725. In addition, the electric field between the signal conductive line 723 and the ground plane 725 is dependent on the dielectric constant of the insulating layer 727.

The coplanar transmission line 730 may comprise the signal conductive lines 731 and 733 and the insulating layer 727. The thickness and the dielectric constant of the insulating layer 727 may determine the electric field strength generated by the propagating signal. The resonant cavity thickness of a leaky wave antenna may be dependent on the spacing between the signal conductive line 723 and the ground plane 725, or the signal conductive lines 731 and 733.

The substrate 729 may comprise a semiconductor or insulator material that may provide mechanical support for the microstrip transmission line 720, the coplanar transmission line 730, and other devices that may be integrated within. In another embodiment of the invention, the substrate 729 may comprise Si, GaAs, sapphire, InP, GaO, ZnO, CdTe, CdZnTe and/or $Al_2O_3$, for example, or any other substrate material that may be suitable for integrating microstrip structures.

In operation, a bias voltage may be applied across the signal conductive line 723 and the ground plane 725, and/or the signal conductive lines 731 and 733. The thickness of a leaky wave antenna resonant cavity may be dependent on the distance between the microstrip transmission line 720 and/or the coplanar transmission line 730.

In addition to DC bias and ground, a signal to be transmitted or received, such as a 60 GHz RF signal, may be communicated to or from the signal conductive lines 723, 731, and 733, and the ground plane 725. In this manner, the power line traces on the chip 162 may transmit and/or receive signals as well as supply DC bias. In this manner, a clock signal may be transmitted by a leaky wave antenna, with the signal being received by one or more leaky wave antennas on the same chip, thereby providing clock distribution without the need for long conductive clock traces.

Figure 8:
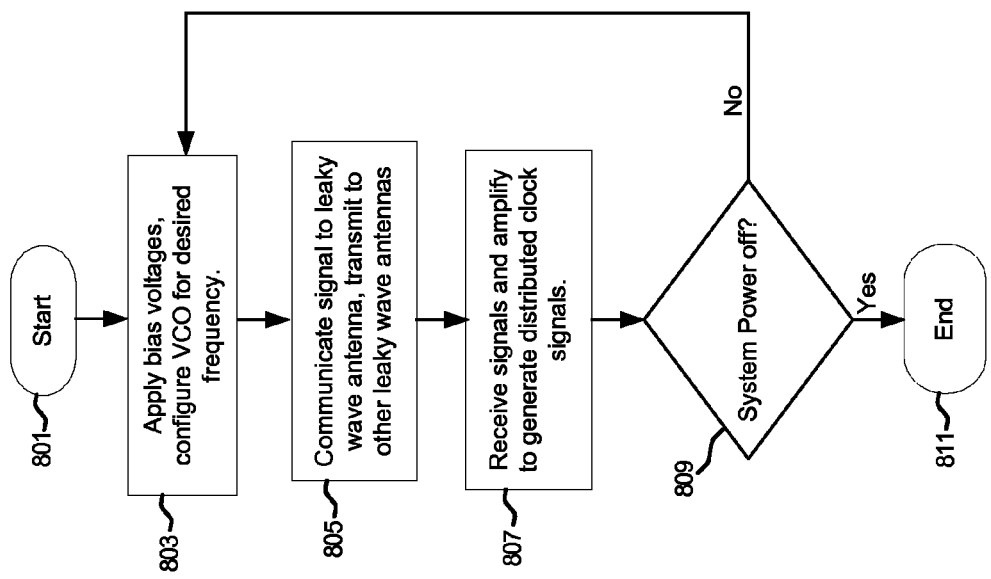
FIG. 8 is a block diagram illustrating exemplary steps for an integrated voltage controlled oscillator-based transmitter and on-chip power distribution network, in accordance with an embodiment of the invention.

FIG. 8 is a block diagram illustrating exemplary steps for an integrated voltage controlled oscillator-based transmitter and on-chip power distribution network, in accordance with an embodiment of the invention. Referring to FIG. 8, in step 803 after start step 801, bias voltage and ground may be applied to supply and/or ground lines, respectively, and the VCO may be configured for a desired frequency clock signal. In step 805, the VCO clock signal may be communicated to and transmitted by a leaky wave antenna to one or more receiving leaky wave antennas. In step 807, the leaky wave antennas may receive the transmitted clock signal and communicate it to LNAs for amplification, thereby generating distributed clock signals. In step 809, in instances where the wireless device 150 is to be powered down, the exemplary steps may proceed to end step 811. In instances when the wireless device 150 is not to be powered down, the exemplary steps may proceed to step 803 to configure the VCO at a desired frequency.

In an embodiment of the invention, a method and system are disclosed for supplying one or more bias voltages and/or ground to a chip 162 utilizing bias voltage 701A and/or ground lines 701B, respectively. One or more voltage-controlled oscillators 165 and one or more low-noise amplifiers 705A-705C may be integrated on the chip 162 and each of the one or more voltage-controlled oscillators 165 and the one or more low-noise amplifiers 705A-705C may be communicatively coupled to a leaky wave antenna 164A, 600, and/or 703A-703D integrated in the bias voltage 701A and/or ground 701B lines to the chip 162. One or more clock signals may be generated utilizing the one or more voltage-controlled oscillators 165. The generated clock signals may be transmitted by the leaky wave antennas 164A, 600, and/or 703B communicatively coupled to the one or more voltage-controlled oscillators 165 to the one or more leaky wave antennas 164A, 600, and/or 703A, 703C, and/or 703D communicatively coupled to the one or more low-noise amplifiers 705A-705C. Radio frequency (RF) signals may be transmitted via the one or more leaky wave antennas 164A, 600, and/or 703B, and may comprise 60 GHz signals. The leaky wave antennas 164A, 600, and/or 703A-703D may comprise microstrip 720 and/or coplanar 730 waveguides, where a cavity length of the leaky wave antennas 164A, 600, and/or 703A-703D may be dependent on a spacing between conductive lines 723 and 725 and/or 731 and 733 in the microstrip 720 and/or coplanar 730 waveguides. The leaky wave antennas 164A, 600, and/or 703A-703D may be configured to transmit the one or more generated clock signals at a desired angle, $\Theta$, from a surface of the chip 162. The desired angle, $\Theta$, from the surface of the chip 162 may be dynamically configured. A gain of the one or more low-noise amplifiers 705A-705C may be configured for receiving the transmitted clock signals.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for an integrated voltage controlled oscillator-based transmitter and on-chip power distribution network.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
performing using one or more or more circuits in a wireless device, said one or more circuits comprising one or more voltage-controlled oscillators and one or more low-noise amplifiers on a chip, wherein each of said one or more voltage-controlled oscillators and said one or more low-noise amplifiers is communicatively coupled to a leaky wave antenna integrated in bias voltage and/or ground lines to said chip:

supplying one or more bias voltages and/or ground for said chip utilizing said bias voltage and/or ground lines, respectively;

generating one or more clock signals utilizing said one or more voltage-controlled oscillators; and transmitting said generated clock signals via said leaky wave antennas communicatively coupled to said one or more voltage-controlled oscillators to said one or more leaky wave antennas communicatively coupled to said one or more low-noise amplifiers.

2. The method according to claim 1, comprising transmitting radio frequency (RF) signals via said one or more leaky wave antennas.

3. The method according to claim 2, wherein said RF signals comprise 60 GHz signals.

4. The method according to claim 1, wherein said leaky wave antennas comprise microstrip waveguides.

5. The method according to claim 4, wherein a cavity length of said leaky wave antennas is dependent on a spacing between conductive lines in said microstrip waveguides.

6. The method according to claim 1, wherein said leaky wave antennas comprise coplanar waveguides.

7. The method according to claim 6, wherein a cavity length of said leaky wave antennas is dependent on a spacing between conductive lines in said coplanar waveguides.

8. The method according to claim 1, comprising configuring said leaky wave antennas to transmit said one or more generated clock signals at a desired angle from a surface of said chip.

9. The method according to claim 8, comprising dynamically configuring said angle from said surface of said chip.

10. The method according to claim 1, comprising configuring a gain of said one or more low-noise amplifiers for receiving said transmitted clock signals.

11. A system for enabling communication, the system comprising:

one or more or more circuits in a wireless device, said one or more circuits comprising one or more voltage-controlled oscillators and one or more low-noise amplifiers on a chip, wherein each said one or more voltage-controlled oscillators and said one or more low-noise amplifiers is communicatively coupled to a leaky wave antenna integrated in bias voltage and/or ground lines to said chip, said one or more circuits being operable to:

supply one or more bias voltages and ground for said chip utilizing said bias voltage and/or ground lines, respectively;

generate one or more clock signals utilizing said one or more voltage-controlled oscillators; and transmit said generated clock signals via said leaky wave antennas communicatively coupled to said one or more voltage-controlled oscillators to said one or more leaky wave antennas communicatively coupled to said one or more low-noise amplifiers.

12. The system according to claim 11, wherein said one or more circuits are operable to transmit radio frequency (RF) signals via said one or more leaky wave antennas.

13. The system according to claim 12, wherein said one or more circuits are operable to wherein said RF signals comprise 60 GHz signals.

14. The system according to claim 11, wherein said leaky wave antennas comprise microstrip waveguides.

15. The system according to claim 14, wherein a cavity length of said leaky wave antennas is dependent on a spacing between conductive lines in said microstrip waveguides.

16. The system according to claim 11, wherein said leaky wave antennas comprise coplanar waveguides.

17. The system according to claim 16, wherein a cavity length of said leaky wave antennas is dependent on a spacing between conductive lines in said coplanar waveguides.

18. The system according to claim 11, wherein said one or more circuits are operable to configure said leaky wave antennas to transmit said one or more generated clock signals at a desired angle from a surface of said chip.

19. The system according to claim 18, wherein said one or more circuits are operable to dynamically configure said angle from said surface of said chip.

20. The system according to claim 11, wherein a gain of said one or more low-noise amplifiers is configured for receiving said transmitted clock signals.

* * * * *